United States Patent [19]
Kister

[11] Patent Number: 5,422,574
[45] Date of Patent: Jun. 6, 1995

[54] LARGE SCALE PROTRUSION MEMBRANE FOR SEMICONDUCTOR DEVICES UNDER TEST WITH VERY HIGH PIN COUNTS

[75] Inventor: January Kister, Palo Alto, Calif.

[73] Assignee: Probe Technology Corporation, Santa Clara, Calif.

[21] Appl. No.: 4,447

[22] Filed: Jan. 14, 1993

[51] Int. Cl.⁶ .............................................. G01R 1/06
[52] U.S. Cl. ..................................................... 324/754
[58] Field of Search ............... 324/158 P, 158 F, 72.5, 324/754, 757; 439/482, 824

[56] References Cited

U.S. PATENT DOCUMENTS

| | | | |
|---|---|---|---|
| 4,906,920 | 3/1990 | Huff et al. | 324/158 F |
| 4,912,390 | 3/1990 | Greub et al. | 324/72.5 |
| 4,918,383 | 4/1990 | Huff et al. | 324/158 F |
| 4,922,192 | 5/1990 | Gross et al. | 324/72.5 |
| 4,975,638 | 12/1990 | Evans et al. | 324/72.5 |
| 4,980,637 | 12/1990 | Huff et al. | 324/158 F |

Primary Examiner—Vinh Nguyen
Attorney, Agent, or Firm—Thomas E. Schatzel

[57] ABSTRACT

An embodiment of the present invention is a probe membrane with a center contact bump area and a plurality of signal connection sections separated by triangular reliefs in the membrane and terminating in a tangential row of contacts for wire bonding to a probe card. The system of triangular reliefs in the membrane allows the membrane to be puckered up such that the center contact bump area is raised approximately ninety mils above the general plane of the probe card. When the membrane has been fixed in its puckered up position, the triangular reliefs in the membrane form several radial rectangular slits. A translator gimbal attached to the center of the membrane provides stability and contact force for the contact bumps to a DUT. Areas of transparency in the vicinity of the contact bump area allows a user to view the I/O pads of a DUT for alignment with the contact bumps in the membrane.

6 Claims, 6 Drawing Sheets

LARGE SCALE PROTRUSION MEMBRANE FOR SEMICONDUCTOR DEVICES UNDER TEST WITH VERY HIGH PIN COUNTS

BACKGROUND OF THE INVENTION

1. Field of the Invention

This invention relates generally to apparatus for the testing of integrated circuits (ICs) and more specifically to a probe testing system comprising a formed membrane including a multi-layer flex circuit for contacting chips with large numbers of contact pads.

2. Description of the Prior Art

Semiconductor integrated circuit (IC) devices are typically manufactured from thin, round silicon wafer slices as large as ten inches in diameter. Each such wafer can yield hundreds of IC devices. After a combination of masking, diffusion, and etching steps, the individual wafers are diced into individual chips, or dice, for further processing and packaging. Unnecessary expense can be avoided by identifying defective chips as early in the fabrication process as possible, especially before the final step of packaging. Defective chips are typically identified by testing each of the circuits on a wafer with a probe that is able to make contact with the rows of connection pads on the perimeters of the respective chips. Chips that do not pass a series of tests are marked and later discarded. Therefore, only operational chips will reach the additional manufacturing steps and concomitant expenses of wire bonding and plastic molding in device packages.

Recent breakthroughs in packaging technology have overcome traditional barriers that existed which severely limited package pin counts. It is now possible to economically construct an IC with a hundred or more input/output pins. Each such pin has a corresponding pad on a bare chip that is probed during interim testing.

The testing operation may be performed at a wafer level before the wafers are sawn apart into individual chips. A test system typically comprises a test controller for executing and controlling a series of test programs, a wafer dispensing system for mechanically handling and positioning wafers in preparation for testing and a probe card for maintaining an accurate mechanical contact with the device-under-test (DUT). The probe card further provides an electrical interface between the test controller and the DUT and includes a printed circuit board (PCB), which is sometimes referred to as a performance board. Performance boards are typically customized for individual ICs or IC families. The probe card comprises a plurality of test probes positioned to accurately coincide with the input/output (I/O) pads of the DUT.

The test controller generates a series of patterns of test signals that include specific combinations of voltages and currents which stimulate a DUT. The test signals are coupled via the performance board and its test probes. A particular chip's responses to the test signals are input by the probes and coupled back to the test controller via the performance board. The voltage, current and/or frequency responses from the DUT are monitored and analyzed. The response signal patterns are typically compared with a set of predetermined patterns. Chips which are determined not to have met predetermined testing criteria are culled from the lot, the remainder of the chips pass on for further processing.

One type of conventional wafer probe comprises many fine styluses, or probes, mounted on a performance board. The tips of such probes are positioned to contact the I/O pads of a single DUT chip. The opposite ends of the probes are typically soldered to traces of printed circuits on the performance board and couple DUT signals to the test controller. A wafer dispensing system delivers a wafer to be tested to a position under the probe card, aligns the wafer and raises it until electrical connection is established between the probes and the I/O pads of a DUT.

A membrane probe technology for wafer probing typically includes an array of micro-contacts ("contact bumps") on a protruding part of a thin, flexible dielectric film membrane. The extent of the protrusion is referred to as the "probe depth". A microstrip transmission line is formed on the membrane for each contact bump electric connection to the performance board. Individual contact bumps are typically formed by a metal plating method. Photolithographic methods are conventionally used to produce the microstrips.

U.S. Pat. No. 5,180,977, entitled, "MEMBRANE PROBE CONTACT BUMP COMPLIANCY SYSTEM," by Richard E. Huff, describes one such membrane probe technology. Two other U.S. Pat. Nos. 4,906,920, and 4,918,383, both to Richard E. Huff, et al., also describe membrane probes. The '920-patent describes a membrane probe which has a self-leveling mechanism to improve the surface coplanar alignment between a membrane probe and a DUT. An elastomeric bed is used to cushion the force of the probe on the DUT. The '383 patent describes a membrane probe with an automatic contact scrub action obtained from a fixed leaf spring and two variable leaf springs that create an asymmetry which causes a probe card to move laterally as a set of contact bumps engage a wafer.

Membrane probes thus need no extending needles or blades to hold the fine probe tips in place, because the contact bumps can be formed directly on a supporting membrane, unlike the conventional probes. The contact bumps permit large numbers of contacts with high probe density. Improvements in mechanical and electric performance may also be realized by the membrane probes because of the simplicity of its configurations. Typical support membranes are comprised of conventional flex circuit with etched copper traces.

A prerequisite for successful IC testing by either membrane or conventional probe cards is the establishment of proper electrical contact between the probes and I/O pads on a DUT chip. In practice, a probe card and its probe tips or contact bumps may not be exactly coplanar with the surface of the DUT's I/O pads. In the case of membrane probe cards, a self-leveling system is used to accommodate this non-coplanarity condition. To compensate for the same such variations with conventional probe cards, a wafer dispensing system is controlled to raise the wafer a predetermined distance beyond the first point of contact to force a proper contact with all the probes. Such practice is generally referred to as "overdrive".

Nonconductive oxide films typically form on the surface of the I/O pads on a DUT and can interfere with good testing. Such film layers are typically only five to ten nanometers thick, but a concomitant high degree of resistance nevertheless substantially impairs current, voltage, and/or frequency response measurements. Conventional probe cards resolve such problems by tilting each probe at a slight angle with respect to the plane of the DUT. Thus, as the probes are deflected by contact with a wafer, each probe skids along the surface of the corresponding I/O pad. This small horizontal movement produces a scrubbing action that is sufficiently vigorous to remove the surface oxide film on a typical DUT. Membrane probe incorporate a scrubbing motion by using a set of flexure pivot assemblies.

The probes and the membrane with its contact bumps are therefore subjected to the forces of vertical overdrive and horizontal pulling and scrubbing in the test operations. These stressful operation conditions can cause the membrane to lose resiliency. Material deterioration's and structure break down can also occur which cause premature damages of the probe card.

The contact bump area of a typical membrane probe must protrude out to a probe depth of approximately ninety mils from the general plane of a probe card, such that only the contact bumps contact a wafer DUT. With limited numbers of contacts to be made and a resulting use of non-multi-layer circuit membranes, it has been practical to form the membrane protrusion by stretching the membrane under controlled heat and pressure conditions.

High DUT pin counts and corresponding high number counts of contact bumps have dictated the use of multi-layer flex circuit materials for use as probe membranes. Multiple circuit layers are needed to carry the large number of signal wires necessary and advantage can be taken of power-planing and ground-planing techniques. But such multi-layer membranes cannot be stretched to the necessary probe depths because the membranes are too rigid.

SUMMARY OF THE PRESENT INVENTION

It is therefore an object of the present invention to provide a membrane for high pin count DUTs comprising multi-layer flex circuits that can be formed for suitable probe depths.

It is a further object of the present invention to provide a membrane for device probing that is simple and economical to manufacture.

Briefly, a preferred embodiment of the present invention is a probe membrane with a center contact bump area and a plurality of signal connection sections separated by triangular reliefs in the membrane and terminating in respective tangential rows of contacts for wire bonding or pressure contact to a probe card. The system of triangular reliefs in the membrane is such that the membrane may be puckered up such that the center contact bump area can be raised approximately ninety mils above the general plane of the probe card. In its final assembly when the membrane has been fixed in its puckered up position, the triangular reliefs in the membrane form several radial rectangular slits. A translator gimbal attached to the center of the membrane provides stability and contact force for the contact bumps to a DUT. Several areas of transparency in the vicinity of the contact bump area are provided for a user to view the I/O pads of a DUT such that alignment with the contact bumps in the membrane can be inspected by the user.

An advantage of the present invention is that it provides a membrane that is economical to manufacture.

Another advantage of the present invention is that a probe membrane comprised of multi layer circuits is made possible.

These and other objects and advantages of the present invention will no doubt become obvious to those of ordinary skill in the art after having read the following detailed description of the preferred embodiments which are illustrated in the various drawing figures.

DETAILED DESCRIPTION OF THE EMBODIMENTS

Figure 1:
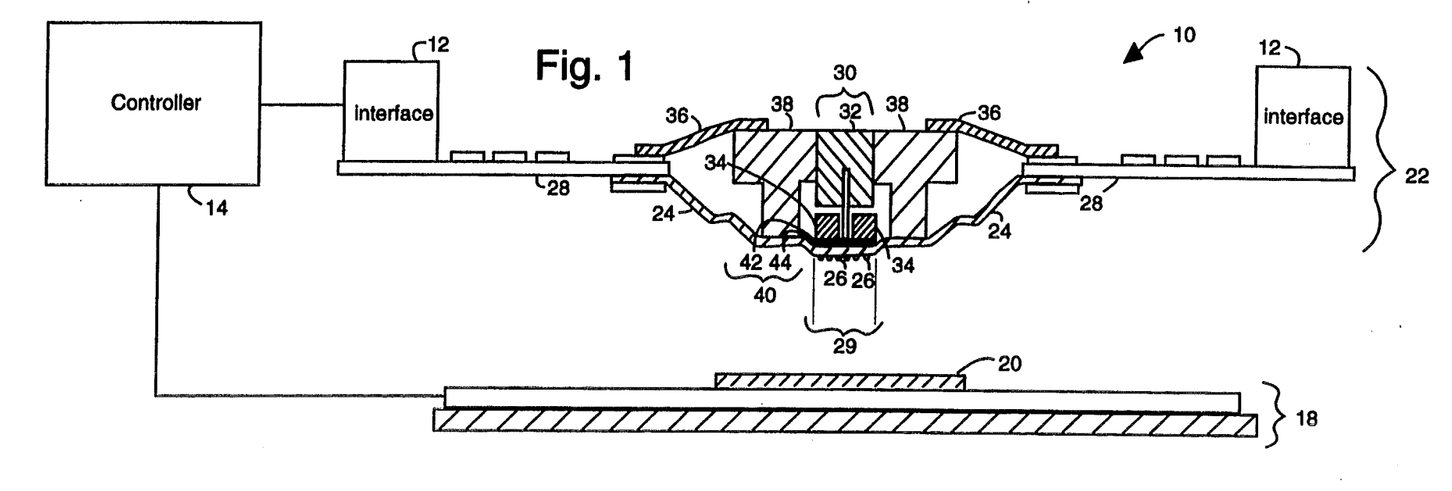
FIG. 1 is a cross sectional view of an IC wafer test system embodiment of the present invention.

FIG. 1 illustrates an IC wafer test system embodiment of the present invention, referred to by the general reference numeral 10. Test system 10 comprises an interface 12, a test controller 14, a wafer dispensing system 18 for delivering and positioning a device-under-test (DUT) 20 and a probe assembly 22. Test controller 14 controls and executes test programs that exercise circuit functions included in DUT 20. Wafer dispensing system 18 manipulates and positions an IC wafer, e.g., DUT 20, in preparation for a test contact by probe assembly 22. Wafer dispensing system 18 and probe assembly 22 are electrically connected to and under the control of test controller 14. Test controller 14 executes test software programs and analyzes test results to determine whether an IC chip has passed or failed a specific set of functional tests. Such stimulation and analysis is conventional. In a typical test sequence, the wafer dispensing system 18 positions a DUT at a predefined location such that the wafer's I/O pads align and contact the proper points in probe assembly 22. Specific measurements of currents, voltage, or frequency responses are performed by probe assembly 22 and these output signals are transmitted to test controller 14 for test analyses.

Probe assembly 22 includes a membrane 24 that comprises a layered sandwich of thin dielectric films, signal trace layers and power plane layers. For example, membrane 24 may be comprised of polyimide film. A plurality of contact bumps 26 are formed on one side and generally near the center of membrane 24. The contact bumps 26 are preferably arranged in a pin-grid array, rectangular perimeter or square perimeter to match a preexisting pattern of a predetermined device that is to be tested (e.g., the DUT 20). Conductors within membrane 24 are patterned to make corresponding connections at the outer perimeters of membrane 24 that have contact spacings more typical of standard printed circuits, e.g., fifty mils. The layered construction of membrane 24 is generally referred to by those skilled in the art as multilayer flex circuit. Conventional laminating, etching and plating techniques may be employed to form membrane 24. Contact bumps 26, and alternative microstrip transmission lines internal to membrane 24, may be patterned using conventional photolithographic techniques.

Membrane 24 is attached to a performance board 28, which is a printed circuit board carrier for interfacing membrane 24 to test controller 14. Membrane 24 protrudes approximately ninety mils in an area 29 proximate to contact bumps 26. Such probe depths of ninety mils may be adjusted to suit particular applications. Membrane 24 is not necessarily heated or stretched to achieve such probe depths. Excessive heating and/or stretching may, in fact, damage membrane 24, especially any fine signal conductor traces within the laminated structure of membrane 24. Membrane 24 is bowed before attachment to board 28 to cause a slight rise near the center of membrane 24 in the vicinity of contact bumps 26. A system of cutouts, illustrated in FIGS. 2 and 3, facilitate such forming. Epoxy may be used for permanent attachment and retention of a selected probe depth. Wire bonding and pressure contact connection of membrane 24 to board 28 is typically used to complete necessary electrical connections. A representative membrane 24 will include six lines of attachment to board 28 and one to two hundred wire-bonded connections.

A force delivery mechanism 30 is attached to performance board 28 to generate vertical and horizontal relative movement and pressures during probe engagement with a wafer under test, and is conventional. Force delivery mechanism 30 includes an upper translation stage 32, a lower translation stage 34, a plurality of leaf springs 36 and a side translation stage 38 that attach to membrane 24 and performance board 28. A contact compliancy system 40, located between lower translation stage 34 and membrane 24, comprises a elastomer layer 42 and a deflectable protection layer 44. The contact compliancy system 40 cushions contact bumps 26 as they touch down on the I/O pads of a DUT. Other suitable force delivery mechanisms and contact compliancy systems may be used, those described here should not be understood as limiting the present invention.

Force delivery mechanism 30 and wafer dispensing system 18, in concert, apply the required forces to membrane 24 to engage contact bumps 26 with I/O pads on DUT 20. The process of contact engagement is managed by test controller 14. Mechanical contact forces are manipulated to assure that good electrical contact is established between contact bumps 26 and I/O pads on DUTs that thereby promote accurate testing of IC chips.

Figure 2:
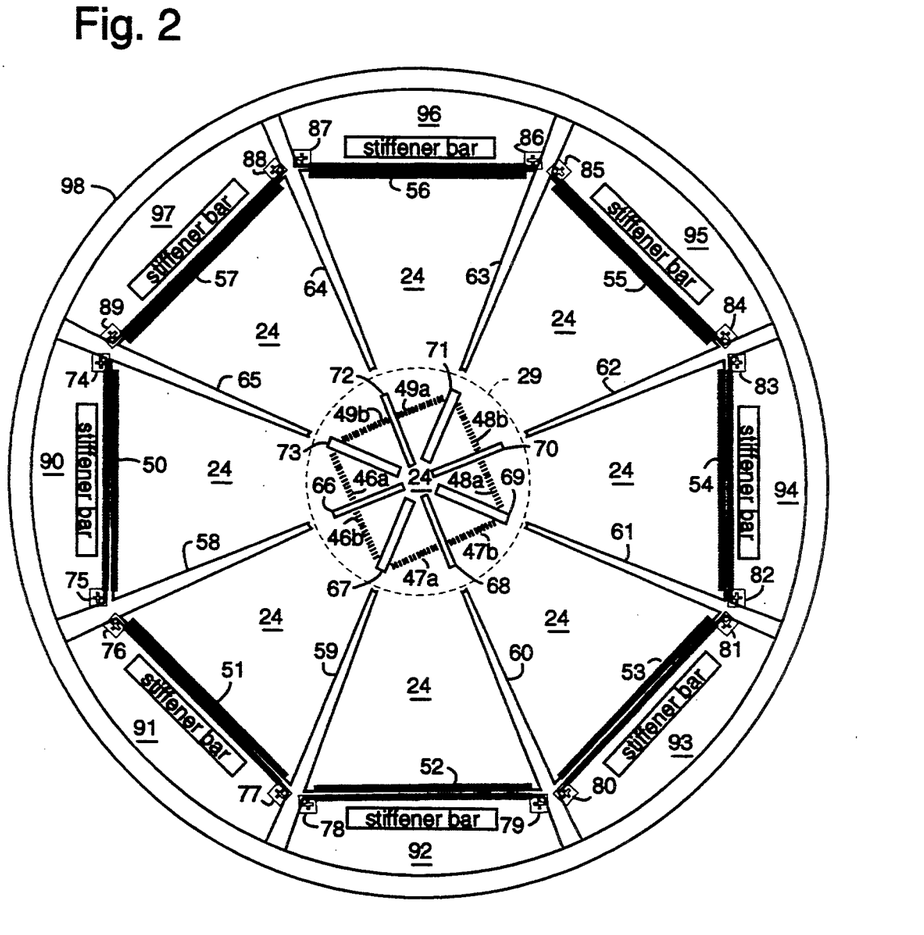
FIG. 2 is a plan elevation of a probe membrane included in the system of FIG. 1 in its flat state and attached to a process ring.

FIG. 2 illustrates membrane 24 in plan elevation and in its flat state before being puckered up to create protrusion area 29 and before being assembled to probe assembly 22. DUT 20 is typical of semiconductor chips in that it has a square shape and four orthogonally arranged rows of I/O pads on its outer perimeter. Therefore, contact bumps 26 are arranged in a set of four rows labeled 46a and 46b through 49a and 49b that connect via etched copper traces within membrane 24 to a set of corresponding connectors 50-57. A series of triangular slits 58-65 allows connectors 50-57 to be gathered slightly-on a common planar surface such that area 29 will rise, preferably ninety mils above such common planar surface. A plurality of areas 66-73 represent areas of transparency through membrane 24. Preferably, membrane 24 includes full power and ground planes to provide good high frequency signal performance. However, such planes can obstruct visibility through membrane 24 because they are typically comprised of solid sheets of copper. Therefore, areas 66-73 comprise window style openings in such conductive planes that allow a user to see through membrane 24 to view a pattern of I/O pads on DUT 20 such that the I/O pads can be properly aligned with contact bumps 26. A system of targets 74-89 are provided for alignment with matching targets on probe board 28. Targets 74-89 permit an assembly person to precisely align each of rows 50-57 for epoxy attachment to board 28 and provide for a sufficient probe depth for area 29. Precision alignment of connectors in rows 50-57 is facilitated when the respective rows lie on a tangential line to a radial that passes through the center of membrane 24. For example, a radial line that bisects an angle between slits 63 and 64 is preferably tangent to a line along which row 56 is arranged. As area 29 is lifted perpendicular to the plane of board 28, all points along connector row 56 will increment by the same amount, thus simplifying the task of epoxy attachment and wire-bonding of membrane 24 to board 28.

A laser is preferably used to separate a set of eight tabs 90-97 from membrane 24 along corresponding lines next to connectors 50-57 and to open slits 58-65. Tabs 90-97 thereafter remain attached to a process ring 98 which is removed and discarded after laser separation. Process ring 98 serves to keep the film material of membrane 24 taut during its fabrication. The petal-like ends of membrane 24 terminating in connector rows 50-57 may have a tendency to curl or cup when separated from tabs 90-97. Such curling and cupping can complicate and/or frustrate attempts to attach membrane 24 to board 28. It may be beneficial therefore to epoxy individual metal stiffener bars across the widths of tabs 90-97 parallel to and just outside of connector rows 50-57 before separation of membrane 24 from process ring 98. Such stiffener bars will allow individual alignment and epoxying of connector rows 50-57 to board 28 and can be trimmed away after the epoxy has cured. Wire-bonding or contact clamping would then follow such trimming step.

Figure 3:
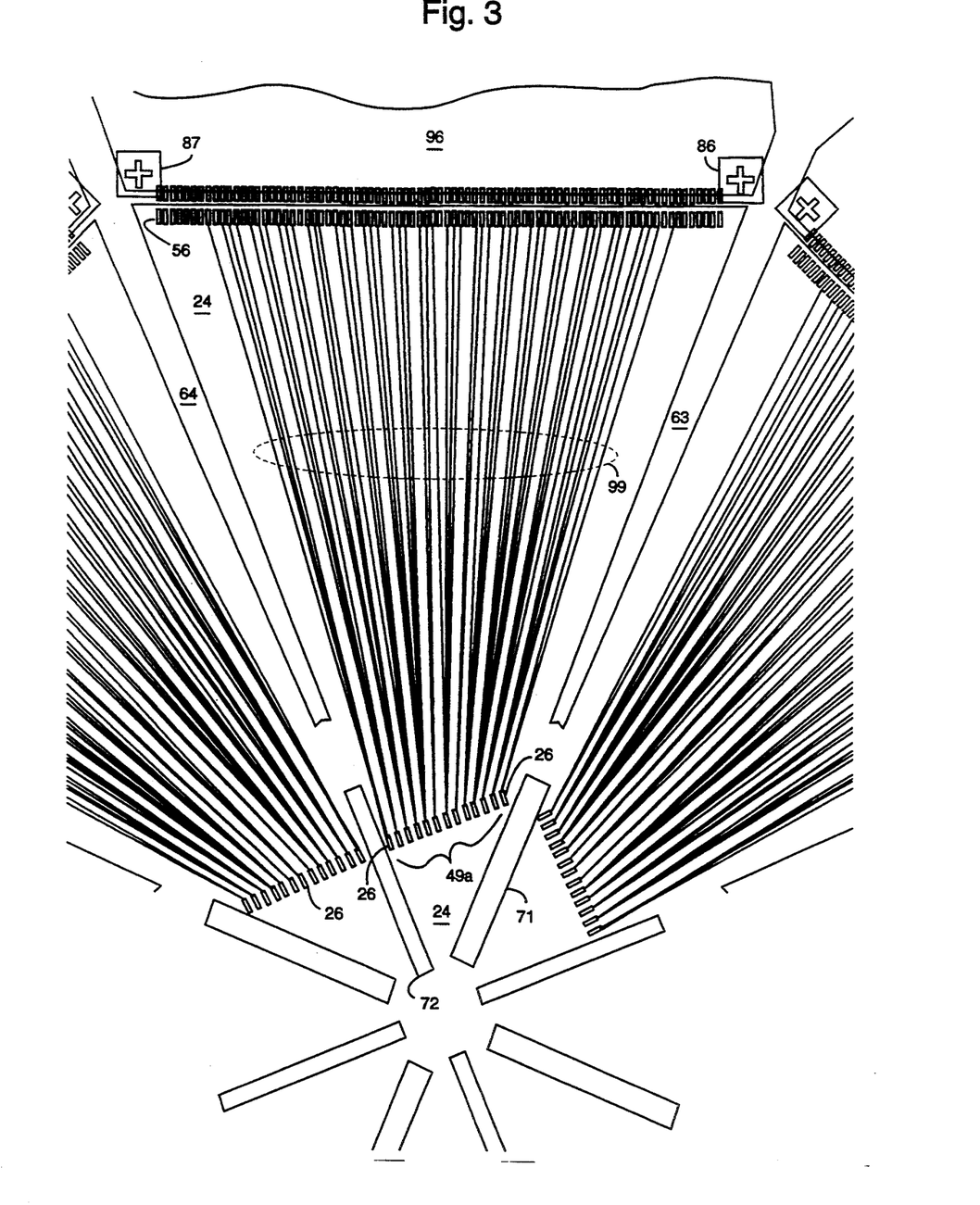
FIG. 3 is an enlarged view of a typical section of the probe membrane of FIG. 2.

FIG. 3 provides an enlargement of one section of membrane 24 before laser detachment from process ring 98 and tabs 90-97. A group of patterned wires 99 are shown in FIG. 3 in a typical connection between contact bumps 26 in row 49a and outer perimeter connector 56. Other wire patterns are possible and practicable given that membrane 24 is a multilayer circuit lamination.

Figure 4A:
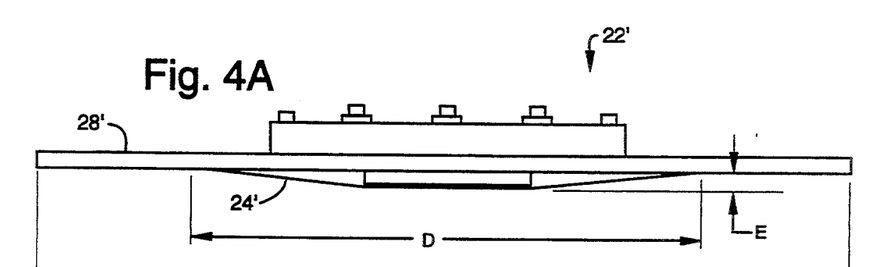
FIG. 4A is a side view of a membrane probe assembly representing a second embodiment of the present invention, and is similar to that of FIG. 1.
Figure 4B:
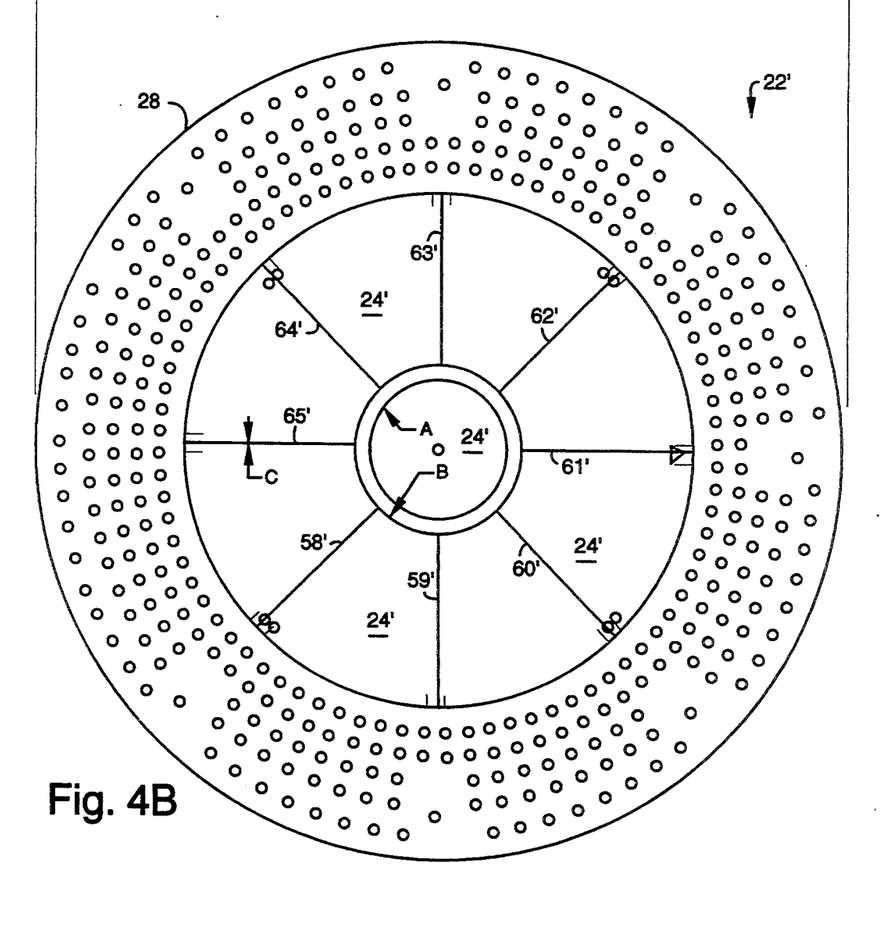
FIG. 4B is a bottom view of the membrane probe assembly of FIG. 4A.

FIGS. 4A and 4B illustrate a membrane probe assembly 22' representing a second embodiment of the present invention. Assembly 22' and its elements are referenced with prime notation in FIGS. 4A and 4B since they are similar to assembly 22 and its corresponding elements illustrated in FIG. 1. A pattern of wiring within membrane 24' is not shown in FIG. 4B so that the other features of assembly 22' may be presented here uncluttered. However, such pattern of wiring, as exemplified by FIG. 3, is necessary for the functioning of assembly 22'. In comparison with membrane 24 shown in FIG. 2, slits 58'-65' have assumed a rectangular shape in FIG. 4B due to the gathering together of the outside perimeter of membrane 24' for attachment to board 28'. In FIG. 4B, and in a representative application, an inner diameter dimension "A" (e.g., area 29 in FIG. 2) is 0.926 inches, an outer diameter dimension "B" is 1.115 inches and a gap dimension is 0.010 inches. In FIG. 4A, a typical diameter "D" for membrane 24' is 3.400 inches and a probe depth dimension "E" is 0.080 inches.

Membrane 24 has been described herein as having eight sections defined by the eight slits 58–65. Different numbers of slits and sections may be employed with lesser or greater success, depending on the particular geometries involved. The present invention is therefore not limited by any particular number of sections or slits in the membrane.

Figure 5:
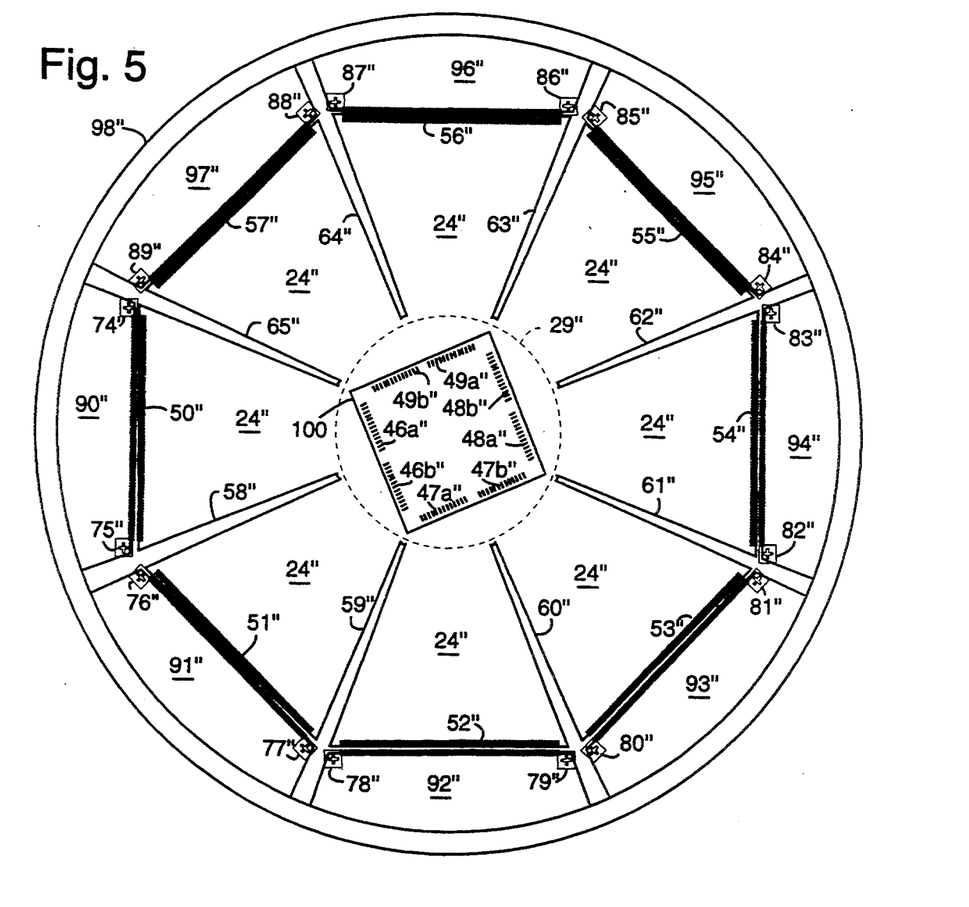
FIG. 5 is similar to FIG. 2 except that an alternative membrane is diagrammed with a central area of transparency that extends outside the perimeters of the probe contacts.

FIG. 5 illustrates an alternative embodiment of membrane 24, referred to by double prime notation 24", together with double prime notation for all the other elements that are similar to those shown in FIG. 2. An area of transparency 100 comprises the removal and elimination of power and ground plane opaque metal material from a central area of membrane 24" to borders just outside contact rows 46a" and 46b" through 49a" and 49b". A user is then able to align membrane 24" by having a full view of the contact bumps. Membrane 24" may be preferred over membrane 24 because all the contact bumps are of equal rigidity, due to all the contact bumps in contact rows 46a" and 46b" through 49a" and 49b" being evenly clear of the power and ground planes, which add rigidity.

Figure 6:
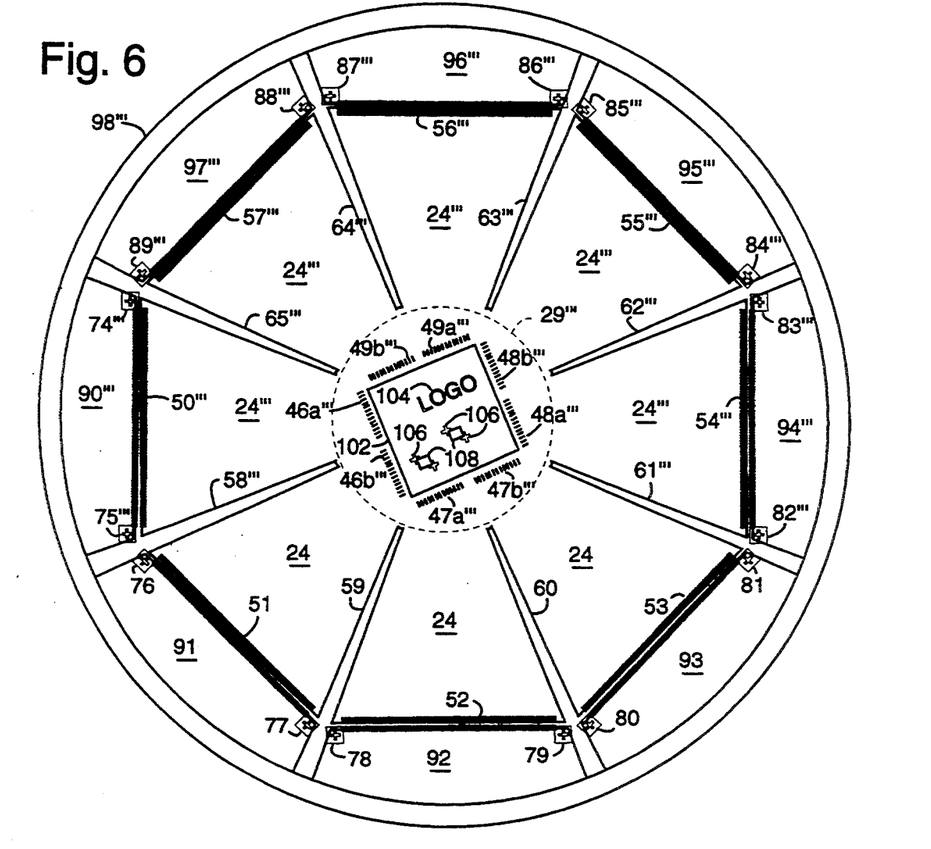
FIG. 6 is a partial view of a membrane similar to that in FIGS. 2 and 5, except that a central area of transparency does not extend as far as the probe contact perimeters.

FIG. 6 illustrates another alternative embodiment of membrane 24, referred to by triple prime notation 24''', together with triple prime notation for all the other elements that are similar to those shown in FIG. 2. An area of transparency 102 comprises the removal and elimination of power and ground plane opaque metal material from a central area of membrane 24''' to borders just inside contact rows 46a''' and 46b''' through 49a''' and 49b'''. A user aligns membrane 24''' with an outline 104 of a "logo" that happens to be included in the mask design of DUT 20 or with a set of crosses 106 that bracket a set of features 108 that happen to be included in the mask design of DUT 20. Membrane 24''' may be preferred over membrane 24 because all the contact bumps are of equal rigidity, due to the fact that all the contact bumps in contact rows 46a''' and 46b''' through 49a''' and 49b''' supported equally by the power and ground planes, which add rigidity.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A membrane probe for making temporary electrical contact with a plurality of signal pads associated with a bare chip semiconductor device-under-test (DUT), the probe comprising:
   a flexible multilayer circuit membrane with surface contact bumps arranged in a rectangular array in a central area of one side of the membrane and including a power plane layer for making an external power supply connection with said DUT and ground plane layer for making an external ground connection with said DUT with at least one window opening proximate to said surface contact bumps in otherwise solid ones of said power plane layer and said ground plane layer for visual alignment of said contact bumps with said signal pads on said DUT;
   a system of slits in the membrane extending from an outer perimeter of the membrane toward said central area for gathering a plurality of petal-like sections of the membrane separated by the system of slits together to raise said central area from a plane of said outer perimeter;
   a process ring connected to an outer perimeter of the flexible membrane for keeping the membrane taut during fabrication; and
   a plurality of stiffener bars attached to a corresponding set of tab extensions of said petal-like sections such that curling of said petal-like sections may be controlled after separating the membrane from the process ring.

2. The probe of claim 1, further comprising:
   a set of four rectangular transparent view ports disposed within the membrane that each lie on a diagonal that intersects a respective corner of said rectangular array of contact bumps such that an alignment between said contact bumps and said signal pads can be inspected by a user.

3. A membrane probe for making temporary electrical contact with a plurality of signal pads associated with a bare chip semiconductor device-under-test (DUT), the probe comprising:
   a flexible multilayer circuit membrane with surface contact bumps arranged in a rectangular array in a central area of one side of the membrane and including a power plane layer for making an external power supply connection with said DUT and ground plane layer for making an external ground connection with said DUT with at least one window opening proximate to said surface contact bumps in otherwise solid ones of said power plane layer and said ground plane layer for visual alignment of said .contact bumps with said signal pads on said DUT;
   a system of slits in the membrane extending from an outer perimeter of the membrane toward said central area for gathering a plurality of petal-like sections of the membrane separated by the system of slits together to raise said central area from a plane of said outer perimeter; and
   a set of four rectangular transparent view ports disposed within the membrane that each lie on a diagonal that intersects a respective corner of said rectangular array of contact bumps such that an alignment between said contact bumps and said signal pads can be inspected by a user.

4. The probe of claim 3, further comprising:
   a process ring connected to an outer perimeter of the flexible membrane for keeping the membrane taut during fabrication; and
   a plurality of stiffener bars attached to a corresponding set of tab extensions of said petal-like sections such that curling of said petal-like sections may be controlled after separating the membrane from the process ring.

5. A membrane probe for making temporary electrical contact with a plurality of signal pads associated with a bare chip semiconductor device-under-test (DUT), the probe comprising:
   a flexible multilayer circuit membrane with surface contact bumps arranged in a rectangular array in a central area of one side of .the membrane and including a power plane layer for making an external power supply connection with said DUT and ground plane layer for making an external ground connection with said DUT with at least one window opening proximate to said surface contact bumps in otherwise solid ones of said power plane layer and said ground plane layer for visual alignment of said contact bumps with said signal pads on said DUT;

a system of slits in the membrane extending from an outer perimeter of the membrane toward said central area for gathering a plurality of petal-like sections of the membrane separated by the system of slits together to raise said central area from a plane of said outer perimeter; and a rectangular transparent port disposed within the membrane and inside said rectangular array of contact bumps and at least one marker disposed on the membrane to bracket a visible surface feature of said semiconductor device such that an alignment between said contact bumps and said signal pads can be accomplished by a user.

6. The probe of claim 5, further comprising:.

a process ring connected to an outer perimeter of the flexible membrane for keeping the membrane taut during fabrication; and a plurality of stiffener bars attached to a corresponding set of tab extensions of said petal-like sections such that curling of said petal-like sections may be controlled after separating the membrane from the process ring.

* * * * *